United States Patent [19]
Bernstein et al.

[11] Patent Number: 5,767,405
[45] Date of Patent: Jun. 16, 1998

[54] COMB-DRIVE MICROMECHANICAL TUNING FORK GYROSCOPE WITH PIEZOELECTRIC READOUT

[75] Inventors: Jonathan J. Bernstein, Medfield; Marc S. Weinberg, Needham, both of Mass.

[73] Assignee: The Charles Stark Draper Laboratory, Inc., Cambridge, Mass.

[21] Appl. No.: 584,377

[22] Filed: Jan. 11, 1996

Related U.S. Application Data

[63] Continuation-in-part of Ser. No. 474,581, Jun. 7, 1995, abandoned, which is a continuation-in-part of Ser. No. 259,989, Jun. 15, 1994, Pat. No. 5,496,436, which is a division of Ser. No. 870,414, Apr. 7, 1992, Pat. No. 5,349,855.

[51] Int. Cl.$^6$ .................................................. G01P 9/04
[52] U.S. Cl. .................................. 73/504.16; 73/504.12
[58] Field of Search ......................... 73/504.12, 504.14, 73/504.15, 504.16, 504.04

[56] References Cited

U.S. PATENT DOCUMENTS

| | | | |
|---|---|---|---|
| Re. 32,931 | 5/1989 | Staudte | 73/505 |
| Re. 33,479 | 12/1990 | Juptner et al. | 73/505 |
| 3,053,095 | 9/1962 | Koril et al. | 73/504 |

(List continued on next page.)

FOREIGN PATENT DOCUMENTS

| | | | |
|---|---|---|---|
| 55-121728 | 9/1980 | Japan | H03H 9/19 |
| 58-136125 | 8/1983 | Japan | H03H 9/17 |
| 59-037722 | 3/1984 | Japan | H03H 9/17 |
| 59-158566 | 9/1984 | Japan | H01L 29/84 |
| 61-144576 | 7/1986 | Japan | G01P 15/09 |
| 62-071256 | 8/1987 | Japan | H01L 27/06 |
| 62-221164 | 9/1987 | Japan | H01L 29/84 |
| 63-169078 | 7/1988 | Japan | H01L 29/84 |
| 2183040 | 5/1987 | United Kingdom | G01F 15/02 |
| 9201941 | 2/1992 | WIPO | G01P 9/04 |
| 9305401 | 3/1993 | WIPO | G01P 9/04 |

OTHER PUBLICATIONS

Barth, P.W. et al., "A Monolithic Silicon Accelerometer With Integral Air Damping and Overrange Protection", 1988 IEEE, pp. 35–38.

Boxenhorn, B., et al., "An Electrostatically Rebalanced Micromechanical Accelerometer," AIAA Guidance, Navigation and Control Conference, Boston, Aug. 14–16, 1989, pp. 118–122.

Boxenhorn, B., et al., "Micromechanical Inertial Guidance System and its Application", Fourteenth Biennial Guidance Test Symposium, vol. 1, Oct. 3–5, 1989, pp. 113–131.

(List continued on next page.)

*Primary Examiner*—John E. Chapman
*Attorney, Agent, or Firm*—Weingarten, Schurgin, Gagnebin & Hayes LLP

[57] ABSTRACT

A microfabricated, tuning fork rate sensitive structure and drive electronics in which vibrational forces are communicated through a set of meshing drive and driven finger electrodes associated with each of two vibrating elements. The vibrating elements are supported in a rotatable assembly between first and second support electrodes which are in turn suspended by flexures for rotation about an axis passing through the flexures and through a point midway between the vibrating elements. Additional masses are formed onto the vibrating elements to improve overall sensor sensitivity. Sense electrodes for detecting capacitive changes between the support beams and the substrate are positioned on the substrate beneath each end of the support beams. In an alternative embodiment, piezoelectric sense capacitors are disposed on the flexures for detecting rotation of the support electrodes. Drive electronics are connected between the driven fingers of the vibrating elements and the drive electrode fingers which mesh with them to cause vibration. Excitation is provided between the support electrodes and the sense electrodes. Any change in signal resulting from rotation of the assembly and the resulting variation in capacitance between the support electrodes and the sense electrodes or within the piezoelectric capacitors is sensed as a measure of inertial rate. A torque loop may be additionally formed using the sense electrodes in order to re-torque the assembly to a neutral position in a torque-to-balance loop.

24 Claims, 18 Drawing Sheets

U.S. PATENT DOCUMENTS

| | | | |
|---|---|---|---|
| 3,251,231 | 5/1966 | Hunt et al. | 73/505 |
| 3,370,458 | 2/1968 | Dillon | 73/141 |
| 3,696,429 | 10/1972 | Tressa | 343/180 |
| 3,846,025 | 11/1974 | Wilber | 356/106 LR |
| 3,913,035 | 10/1975 | Havens | 331/107 R |
| 4,044,305 | 8/1977 | Oberbeck | 324/154 R |
| 4,122,448 | 10/1978 | Martin | 343/7.7 |
| 4,144,764 | 3/1979 | Hartzell, Jr. | 73/497 |
| 4,155,257 | 5/1979 | Wittke | 73/497 |
| 4,234,666 | 11/1980 | Gursky | 428/573 |
| 4,321,500 | 3/1982 | Paros et al. | 310/321 |
| 4,336,718 | 6/1982 | Washburn | 73/517 B |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,414,852 | 11/1983 | McNeill | 73/765 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstien | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,590,801 | 5/1986 | Merhav | 73/510 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 AV |
| 4,705,659 | 11/1987 | Bernstein et al. | 264/29.6 |
| 4,706,374 | 11/1987 | Murkami | 437/225 |
| 4,712,439 | 12/1987 | North | 74/84 R |
| 4,727,752 | 3/1988 | Peters | 73/517 AV |
| 4,735,506 | 4/1988 | Pavlath | 356/350 |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,761,743 | 8/1988 | Wittke | 364/484 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 GY |
| 4,805,456 | 2/1989 | Howe et al. | 73/517 AV |
| 4,808,948 | 2/1989 | Patel et al. | 331/4 |
| 4,834,538 | 5/1989 | Heeks et al. | 356/350 |
| 4,836,023 | 6/1989 | Oikawa | 73/504.14 |
| 4,851,080 | 7/1989 | Howe et al. | 156/647 |
| 4,855,544 | 8/1989 | Glenn | 200/61.45 R |
| 4,869,107 | 9/1989 | Murakami | 73/517 R |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 AV |
| 4,898,032 | 2/1990 | Voles | 73/505 |
| 4,899,587 | 2/1990 | Staudte | 73/505 |
| 4,900,971 | 2/1990 | Kawashima | 73/862.59 |
| 4,901,586 | 2/1990 | Blake et al. | 73/862.59 |
| 4,916,520 | 4/1990 | Kurashima | 357/71 |
| 4,922,756 | 5/1990 | Henrion | 73/517 R |
| 4,929,860 | 5/1990 | Hulsing, II et al. | 310/366 |
| 4,981,359 | 1/1991 | Tazartes et al. | 356/350 |
| 4,991,283 | 2/1991 | Johnson et al. | 29/595 |
| 5,001,383 | 3/1991 | Kawashima | 310/367 |
| 5,014,554 | 5/1991 | Terada et al. | 73/505 |
| 5,016,072 | 5/1991 | Greiff | 357/26 |
| 5,025,346 | 6/1991 | Tang | 361/283 |
| 5,038,613 | 8/1991 | Takenaka et al. | 73/510 |
| 5,060,039 | 10/1991 | Weinberg et al. | 357/26 |
| 5,090,809 | 2/1992 | Ferrar | 356/350 |
| 5,094,537 | 3/1992 | Karpinski, Jr. | 356/350 |
| 5,095,401 | 3/1992 | Zavracky et al. | 361/283 |
| 5,138,883 | 8/1992 | Paquet et al. | 73/504 |
| 5,165,289 | 11/1992 | Tilmans | 73/862.59 |
| 5,177,661 | 1/1993 | Zavracky et al. | 361/283 |
| 5,195,371 | 3/1993 | Greiff | 73/505 |
| 5,203,208 | 4/1993 | Bernstein | 73/505 |
| 5,205,171 | 4/1993 | O'Brien et al. | 73/504 |
| 5,209,119 | 5/1993 | Polla et al. | 73/723 |
| 5,216,490 | 6/1993 | Greiff et al. | 73/517 R |
| 5,226,321 | 7/1993 | Varnham et al. | 73/505 |
| 5,233,874 | 8/1993 | Putty et al. | 73/517 AV |
| 5,241,861 | 9/1993 | Hulsing, II | 73/505 |
| 5,247,252 | 9/1993 | Hamisch et al. | |
| 5,267,471 | 12/1993 | Abraham et al. | 73/105 |
| 5,386,726 | 2/1995 | Terajima | 73/504.16 |

OTHER PUBLICATIONS

Boxenhorn, B., et al., "Monolithic Silicon Accelerometer", *Transducers '89*, Jun. 25–30, 1989, pp. 273–277.

Boxenhorn, B., et al., "A Vibratory Micromechanical Gyroscope", AIAA Guidance, Navigation and Control Conference, Minneapolis, Aug. 15–17, 1988, pp. 1033–1040.

Howe, R., et al., "Silicon Micromechanics: Sensors and Actuators on a Chip", *IEEE Spectrum*, Jul. 1990, pp. 29–35.

Moskalik, L., "Tensometric Accelerometers with Overload Protection", *Meas. Tech. (USA)*, vol. 22, No. 12, Dec. 1979 (publ. May 1980), pp. 1469–1471.

Nakamura, M., et al., "Novel Electrochemical Micro-Machining and Its Application for Semiconductor Acceleration Sensor IC", *Digest of Technical Papers* (1987), Institute of Electrical Engineers of Japan, pp. 112–115.

Petersen, K.E., et al., "Micromechanical Accelerometer Integrated with MOS Detection Circuitry", IEEE, vol. ED-29 No. 1 (Jan. 1982), pp. 23–27.

Petersen, Kurt E., et al., "Silicon as a Mechanical Material", *Proceedings of the IEEE*, vol. 70, No. 5, May 1982 pp. 420–457.

"Quartz Rate Sensor Replaces Gyros", *Defense Electronics*, Nov. 1984, p. 177.

Rosen, Jerome, "Machining In the Micro Domain", *Mechanical Engineering*, Mar. 1989, pp. 40–46.

Teknekron Sensor Development Corporation, article entitled "*Micro–Vibratory Rate Sensor*", 1080 Marsh Road, Menlo Park, CA 94025, 2 pages, undated.

Bryzek, Janusz et al., "Micromachines on the March", *IEEE Spectrum*, May 1994, pp. 20–31.

J. Bernstein et al., "A Micromachined Comb–Drive Tuning Fork Rate Gyroscope", *IEEE Micro Electro Mechanical Systems*, IEEE Catalog No. 93CH3265–6, 1993, pp. 143–148.

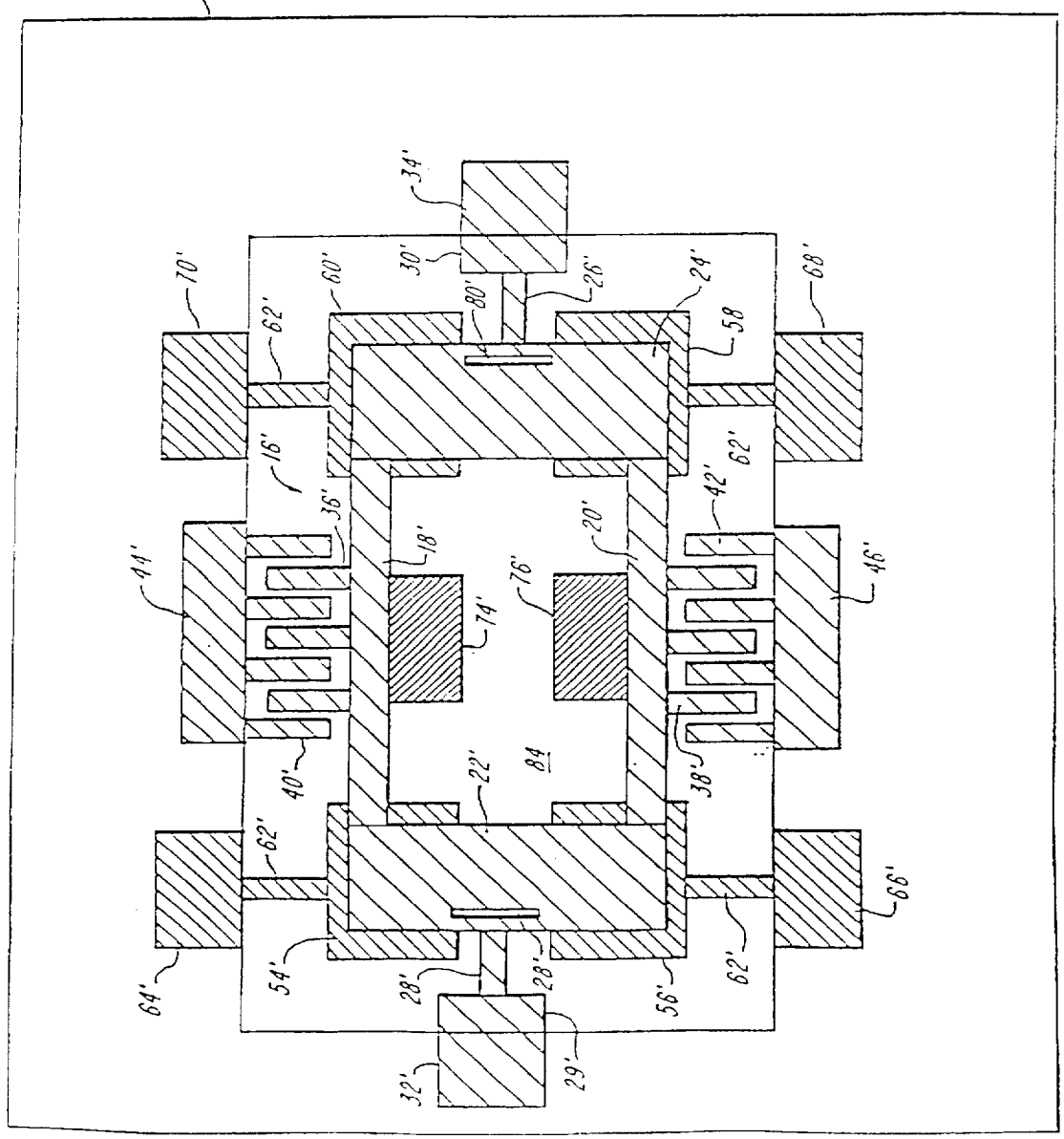

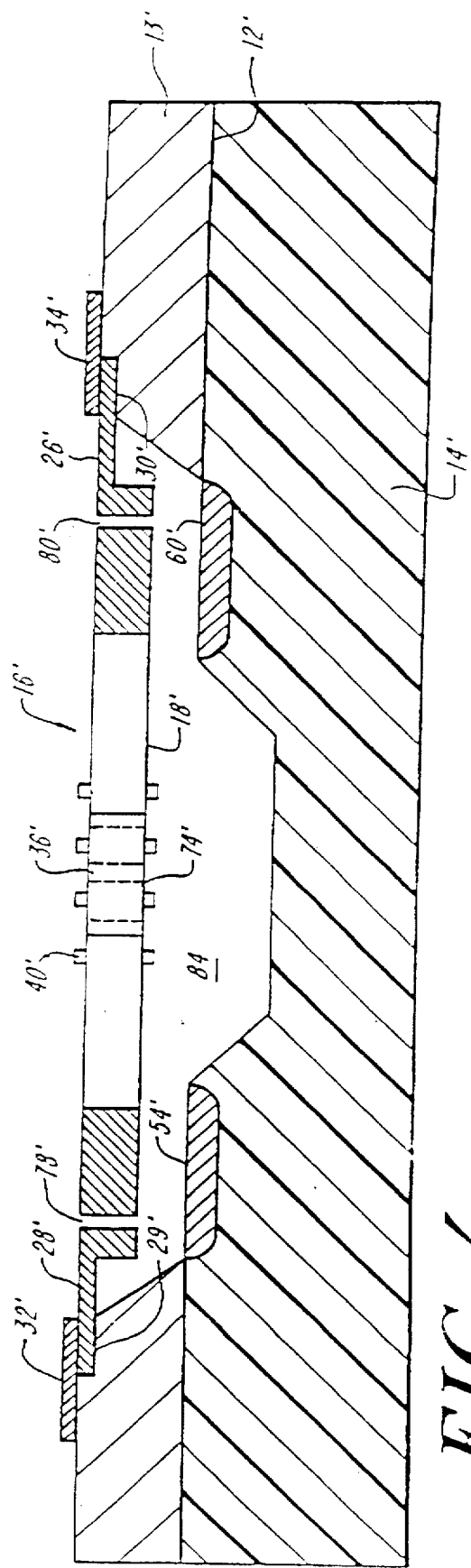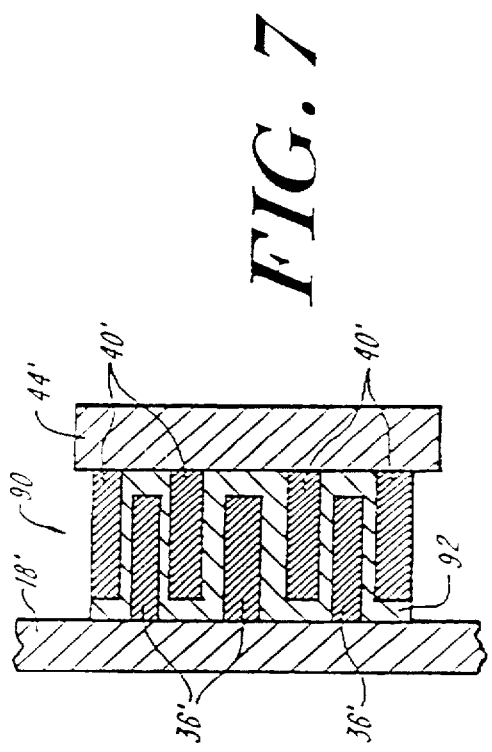

COMB-DRIVE MICROMECHANICAL TUNING FORK GYROSCOPE WITH PIEZOELECTRIC READOUT

RELATED APPLICATION

This application is a continuation-in-part of U.S. patent application Ser. No. 08/474,581, filed Jun. 7, 1995, now abandoned, which is a continuation-in-part of U.S. patent application Ser. No. 08/259,989, filed Jun. 15, 1994, now U.S. Pat. No. 5,496,436, which is a divisional of U.S. Pat. No. 5,349,855, filed Apr. 7, 1992 as U.S. patent application No. 07/870,414 and issued Sep. 27, 1994.

FIELD AND BACKGROUND OF THE INVENTION

The present invention relates to micromechanical microfabricated inertial rate sensors and in particular to a vibrating tuning fork rate sensor having piezoelectric strain sensing transducers. Micromechanical inertial rate sensors are known either of a gyroscopic structure in which a double gimbal system utilizes a vibrating gimbal element, or a tuning fork structure utilizes a vibrating set of tuning forks for sensing inertial rates about an input axis and providing a corresponding motional change or rotation of the suspended element that can be detected to provide an indication of inertial rate. Such microfabricated devices hold a promise for large scale production and therefore low cost. The quest in such devices centers on the desire for improved sensitivity or increased signal to noise ratio in order to increase the range of applications where such devices may be used as well as a reduction in the fabrication steps to reduce overall processing complexity and cost as well as to improve the yield in the manufacture of such devices from silicon wafers using photolithographic techniques well known in the art of semiconductor manufacture.

SUMMARY OF THE INVENTION

According to the teaching of the present invention there is provided a microfabricated tuning fork inertial rate sensor which utilizes a pair of electrode sets comprising meshed electrode fingers for the drive and driven electrodes of each vibrating element in combination with fabrication techniques which together not only improve substantially system sensitivity and signal to noise ratio but reduce the complexity and increase the reliability of microfabrication.

In particular, an assembly comprising first and second vibrating elements supported at their ends by support beams and further having a plurality of driven electrodes extending orthogonally from the vibrating elements is suspended by a set of flexures from each of the opposite support electrodes to a surrounding semiconductor frame or substrate. Supported and extending from the surrounding frame or substrate is a complimentary set of drive electrode fingers which mesh or extend between the fingers of the driven electrodes of the vibrating elements providing substantial overlap and an increased capacitive area therebetween. The vibrating elements are substantially linear, microfabricated elements which extend parallel to and on opposite sides of the axis through the flexures. Additional mass is provided by microfabricating it onto a side of the vibrating elements opposite to the driven fingers extending therefrom.

Four sense and/or torque electrodes are typically buried in the supporting and underlying semiconductor substrate or frame under opposite ends of the support elements for the vibrating elements. Sense and drive electronics are connected to the sense electrodes, the drive fingers and to the flexure supported assembly. The drive electronics sets the vibrating elements into opposed vibration which couples an input rate about an axis parallel to the support axis through the flexures into a rotational vibration of the suspended assembly about the flexures. This motion produces a signal resulting from the variation in capacitance between the support electrodes and the underlying sense electrodes which the sense electronics utilizes as an indication of input rate and, optionally, to torque to rebalance the suspended assembly to a neutral position. Sense and torque electrodes are located beneath electrode supports, and alternatively directly beneath proof masses.

In an alternative embodiment, the sense electronics are connected to piezoelectric transducers disposed on the flexures at opposing ends of the support electrodes. Torque within the piezoelectric regions generates an output voltage in the transducers proportional to the rotational force resulting from the input rate. Electrodes underlying the support elements can optionally be used to apply rebalancing torque. In the summary and throughout the claims the word "piezoelectric" is used to mean either "piezoelecric, ferroelectric, or electrostrictive" since any such materials respond to stress by producing an output charge or voltage.

A micromechanical transducer employing such piezoelectric transducers avoids suspended parts sticking to a substrate, a problem common to devices having narrow suspension gaps for enhanced sensitivity in air-gap capacitors and/or a low level of flexural torque resistance to rotation. Elimination of a narrow sense gap in sensors employing piezoelectric capacitors also eliminates the need for a vacuum package to enhance operation of an air-gap capacitor. Further, the piezoelectric readout is at the vibration frequency of the drive electronics; the sense electronics are thus greatly simplified since no high frequency carriers are necessary.

The microfabricated tuning fork design of the present invention utilizes a large area of capacitance between the drive and driven electrodes in combination with a high change in that capacitance per unit motion of the vibrating elements due to the meshed drive and driven finger configuration. In addition, the fabrication techniques permit the realization of more massive vibrating elements, including the auxiliary masses attached thereto, which together cooperate to increase system sensitivity substantially. Gyroscopic transducers are implemented having multiple proof masses with pairs of meshed drive and driven fingers symmetrically disposed thereabout.

Fabrication techniques which can be simplified over prior designs utilize several exemplary technologies. Among these are forming the suspended assembly and its anchoring electrodes along with the support electrodes for the drive electrode fingers of polysilicon or electroplated metal. The supported assembly may also be microfabricated by selective etching of an epitaxially grown silicon layer over a pre-existing silicon substrate with diffused sense electrodes where the structure of the assembly is defined by boron diffusion into the grown layer and subsequent etching. Wafer bonding technologies may also be utilized to deposit on top of the silicon substrate, by bonding, a highly-doped layer contributed by a second wafer which is ultimately etch removed leaving the superimposed boron doped layer to be photolithographically configured to provide the structure of the rotationally supported assembly. In the alternative embodiment of the present invention employing piezoelectric transducers, such transducers are fabricated by depositing a film of piezoelectric material having a high dielectric constant on the already formed flexures.

3

In all cases the first or underlying substrate will typically be selectively diffused with a boron P+ diffusion to define the underlying sense electrodes, if used, although a surface film of polysilicon or metal may be used, or bridge electrode technology may be utilized as desired.

BRIEF DESCRIPTION OF THE DRAWINGS

These and other features of the present invention are more fully set forth below in the fully exemplary detailed description and accompanying drawing of which:

FIG. 3 is a top diagrammatic view of a comb drive vibrating tuning fork inertial rate sensor according to a second embodiment of the invention;

FIG. 4 is a sectional view of the embodiment of FIG. 3;

FIG. 6 is a sectional view of one form for electrode fabrication;

FIG. 7 is a top view illustrating the fabrication of meshing drive and driven electrodes according to an alternative fabrication technique of the invention;

DETAILED DESCRIPTION OF THE INVENTION

The specification of U.S. Pat. No. 5,349,855 is incorporated herein by reference.

The present invention contemplates an inertial rate sensor such as a tuning fork gyro of micromechanical fabrication as described in the referenced U.S. Patent and in the accompanying drawings in which sense electrodes are formed by piezoelectric transducers. These transducers provide high dielectric constants (on the order of 1300) and thus larger values of capacitance (typically 10 to 100 pF) compared to the air-gap capacitors described therein (typically<1 pF). Such piezoelectric transducers thus improve the signal to noise ratio of the sensor. Thin films of piezoelectric such as lead zirconate titanate (PZT), zinc oxide (ZnO), barium titanate ($BaTiO_3$) or the like are used in the fabrication of the transducers. Electrically conductive traces, as known to one skilled in the art, are employed to are sense electronics, or to force the piezoelectric transducers to act as rebalancing electrodes by supplying strain-inducing voltage at the piezoelectric materials.

Figure 1:
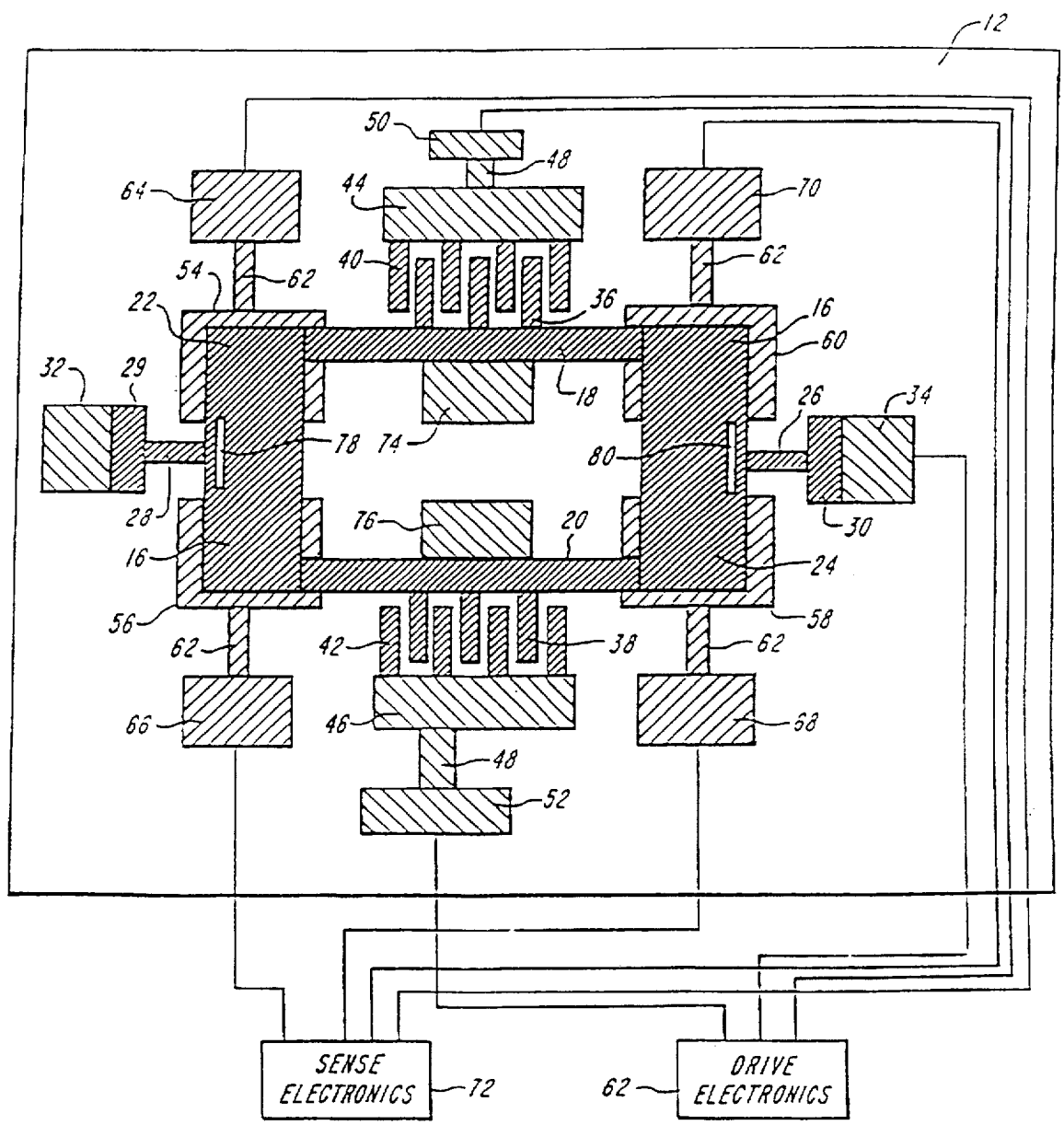
FIG. 1 is a top diagrammatic view of a micromechanical comb drive tuning fork inertial rate sensor according to a first embodiment of the invention.
Figure 8A:
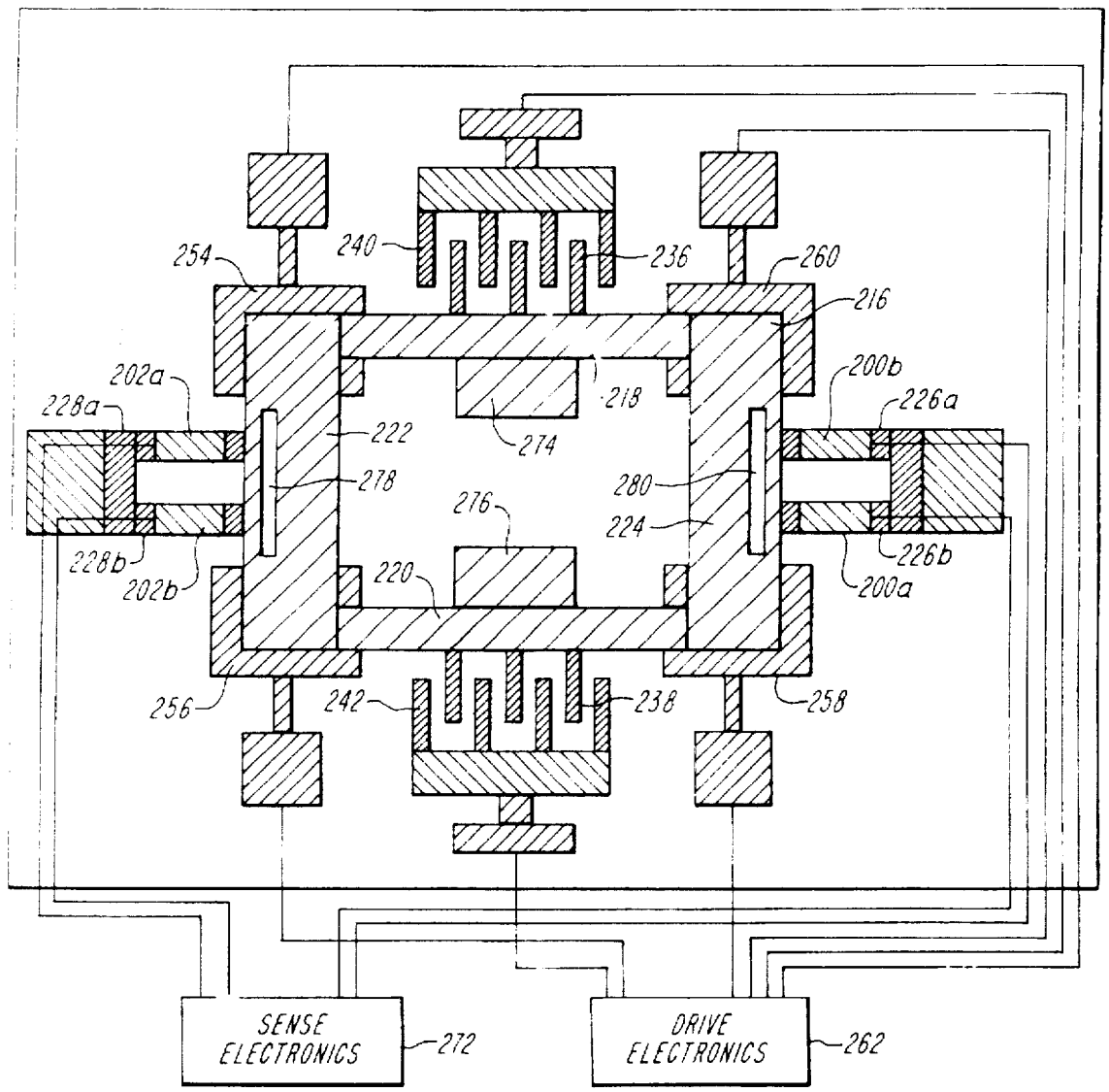
FIGS. 8A and 8B are top diagrammatic views of the micromechanical comb drive tuning fork inertial rate sensor of FIG. 1 having piezoelectric sense transducers.
Figure 8B:
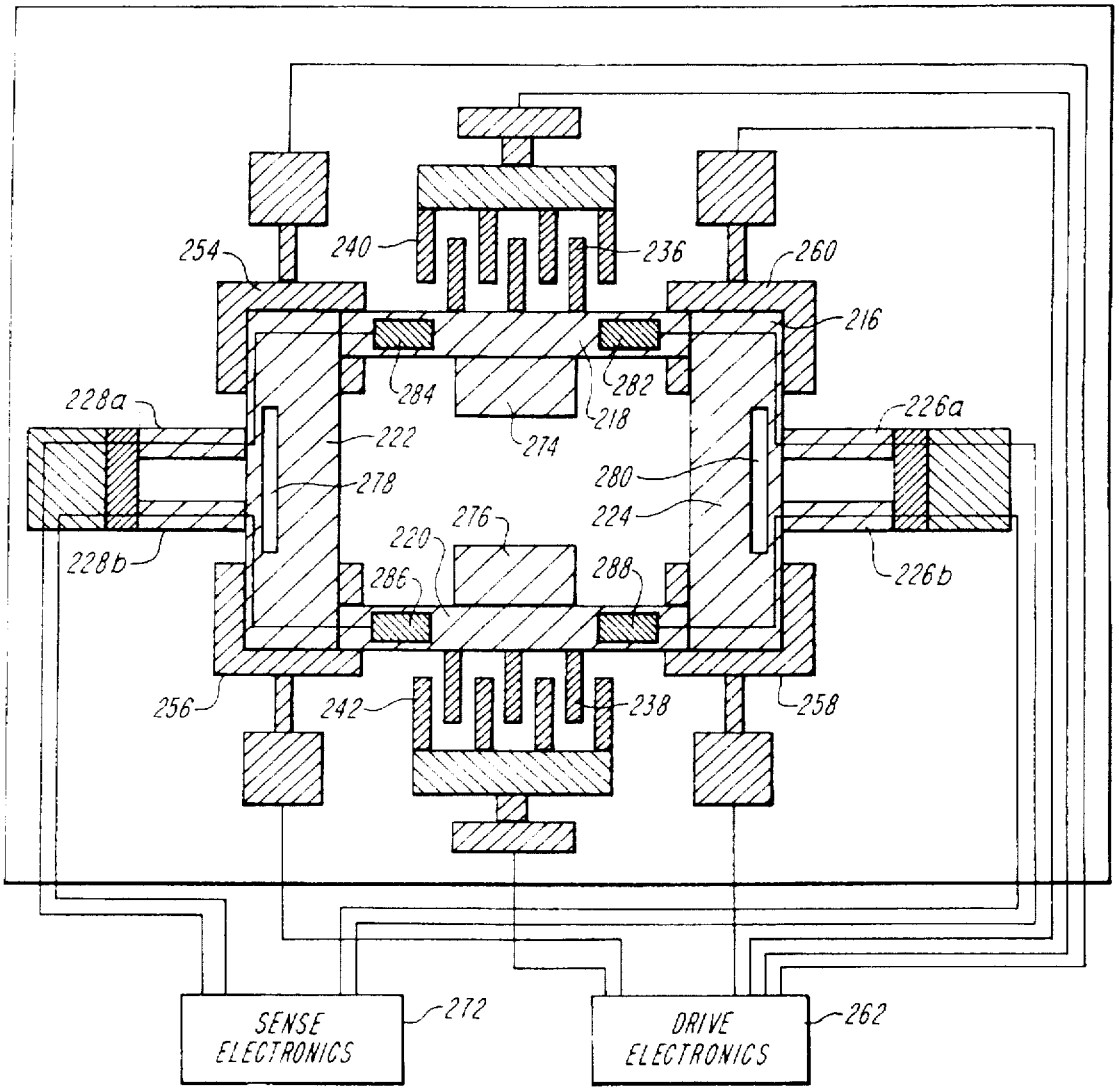

Transducer embodiments employing piezoelectric sensors are illsutrated in FIGS. 8A and 8B, which are in many respects similar to the transducer of FIG. 1 and in which like elements are identified with the same reference numbers as used in FIG. 1 added to 200 (eg. assembly 16 of FIG. 1 is assembly 216 in FIGS. 8A and 8B). In all respects, the transducers operates in the same fashion as described with respect to FIG. 1. Vibration is induced in the vibrating elements 218, 220 by application of electrical signals applied from drive electronics 262 to the drive electrodes 240, 242 and resulting interaction with the driven electrodes 236, 238.

Input rotate rate is sensed about a ration axis defined by an axis extending between the left-hand flexures 228a, 228b of FIG. 8A and the right-hand flexures 226a, 226b, the rotation axis being substantially equidistant between each of the left-hand flexures 228a, 228b and between each of the right-hand flexures 226a, 226b. Output rotation is created by a Coriolis force about the same rotation axis, at the vibration frequency of the gyro. The present sensor detects this rotation by the use of piezoelectric sense transducers 200a, 200b, 202a, 202b disposed on the flexures 226a, 226b, 228a, 228b. Alternate locations for the piezoelectric sense transducers are at reference numbers 282, 284, 286, 288, as illustrated in FIG. 8B. Preferred embodiments of the present invention are only provided with one such set of piezoelectric sense transducers 200a, 200b, 202a, and 202b, or 282, 284, 286, 288. Each sense transducer 200a, 200b, 202a, 202b, or alternately 282, 284, 286, 288, is connected to sense electronics 272. Output rotation, a result of Coriolis forces, creates bending stresses and strains in the aforementioned piezoelectric transducers, which transform the rate induced stresses into a differential output voltage linearly proportional to the input rotation rate.

In the illustrated embodiments of FIGS. 8A and 8B, the underlying electrodes 254, 256, 258, 260, used as sense electrodes in the embodiment of FIG. 1, are used as rebalance electrodes and are thus connected to the drive electronics 262. It is understood that two of these electrodes 254, 256, 258, 260 could be used for rebalancing instead of four, depending upon the application.

The suspended assembly, including the vibrating elements 218, 220, the driven and drive electrodes 240, 242, 236, 238, the additional weights or masses 74, 76, the support electrodes 222, 224, and the flexures 228a, 226b, 226a, 226b, are formed according to a fabrication technique such that these elements are of polysilcon or electroplated metal. In a further embodiment, the suspended asssembly is microfabricated by selective etching of an epitaxially grown silicon layer over a pre-existing silicon substrate with diffused sense electrodes where the structure of the assembly is defined by boron diffusion into the grown layer and subsequent etching. Wafer bonding technologies may also be utilized to deposit on top of the silicon substrate, by bonding, a highly-doped layer contributed by a second wafer which is ultimately etch removed leaving the superimposed boron doped layer to be photolithographically configured to provide the structure of the rotationally supported assembly. In the alternative embodiment of the present invention employing piezoelectric capacitors, such capacitors are fabricated by depositing a film of piezoelectric material having a high dielectric constant on the already formed fllexures. In all cases, the first or underlying substrate will typically be selectively diffused with a boron P+ diffusion to define the underlying sense electrodes, if used, or bridge electrode technology may be utilized as desired.

Figure 9A:
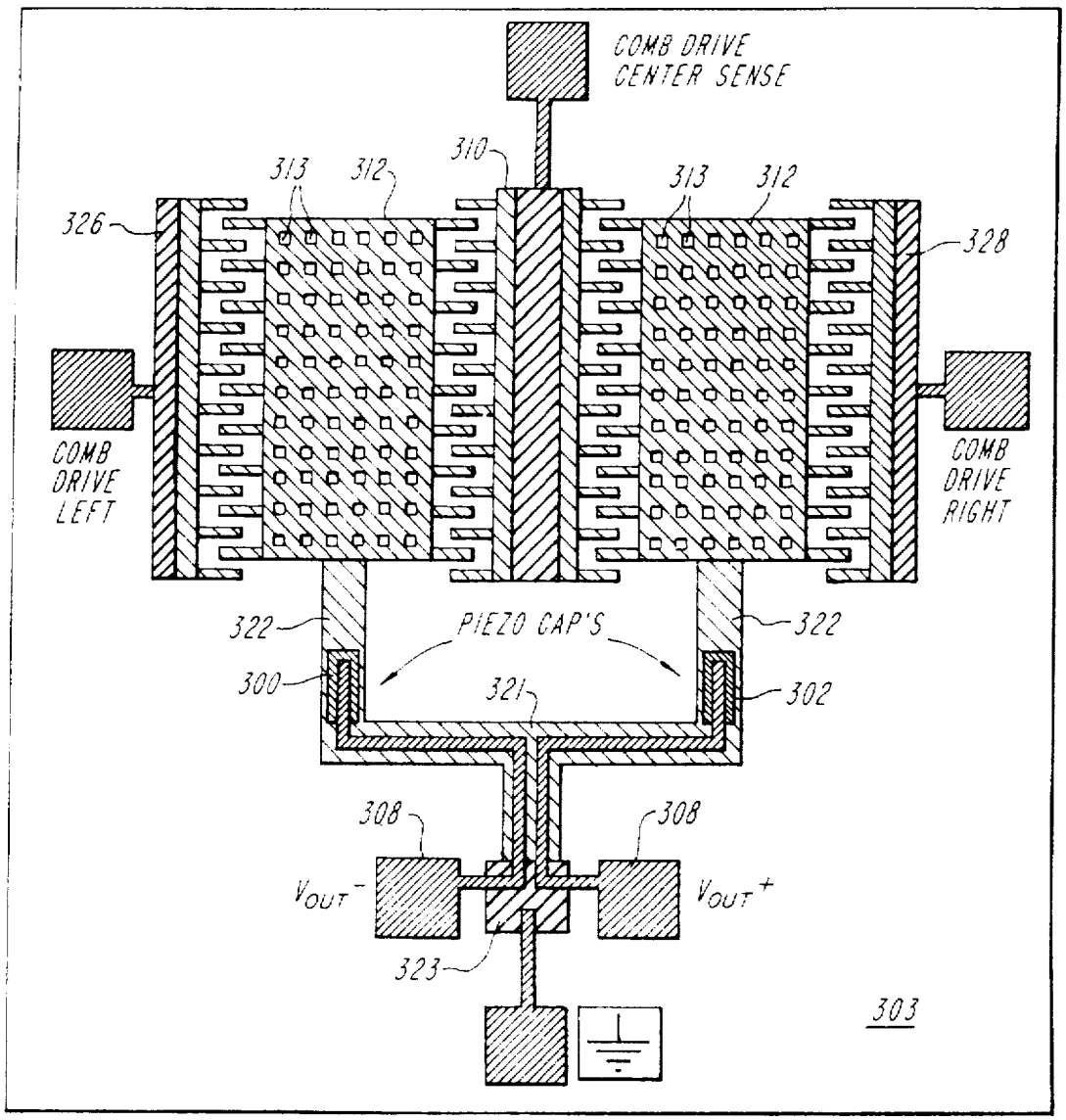
FIG. 9A is a top diagrammatic view of an alternative embodiment of a micromechanical comb drive tuning fork inertial rate sensor having piezoelectric sense transducers.

An alternate embodiment of the micromechanical transducer, a single-ended comb-drive gyroscope, is illustrated in FIG. 9A. This gyroscope has a center motor 310 (also referred to as a comb drive center sense) and proof masses 312 with comb structures disposed on both sides thereof. The comb-drive fingers may be curved about a common center of rotation to allow greater in-plane motion. The proof masses 312 are each provided with a plurality of through-holes 313, which in a first embodiment have square projections. These holes both enable under-cutting of the proof masses 312 during device fabrication, and minimize damping caused by air resistance during rotation about the sense axis.

Figure 1A:
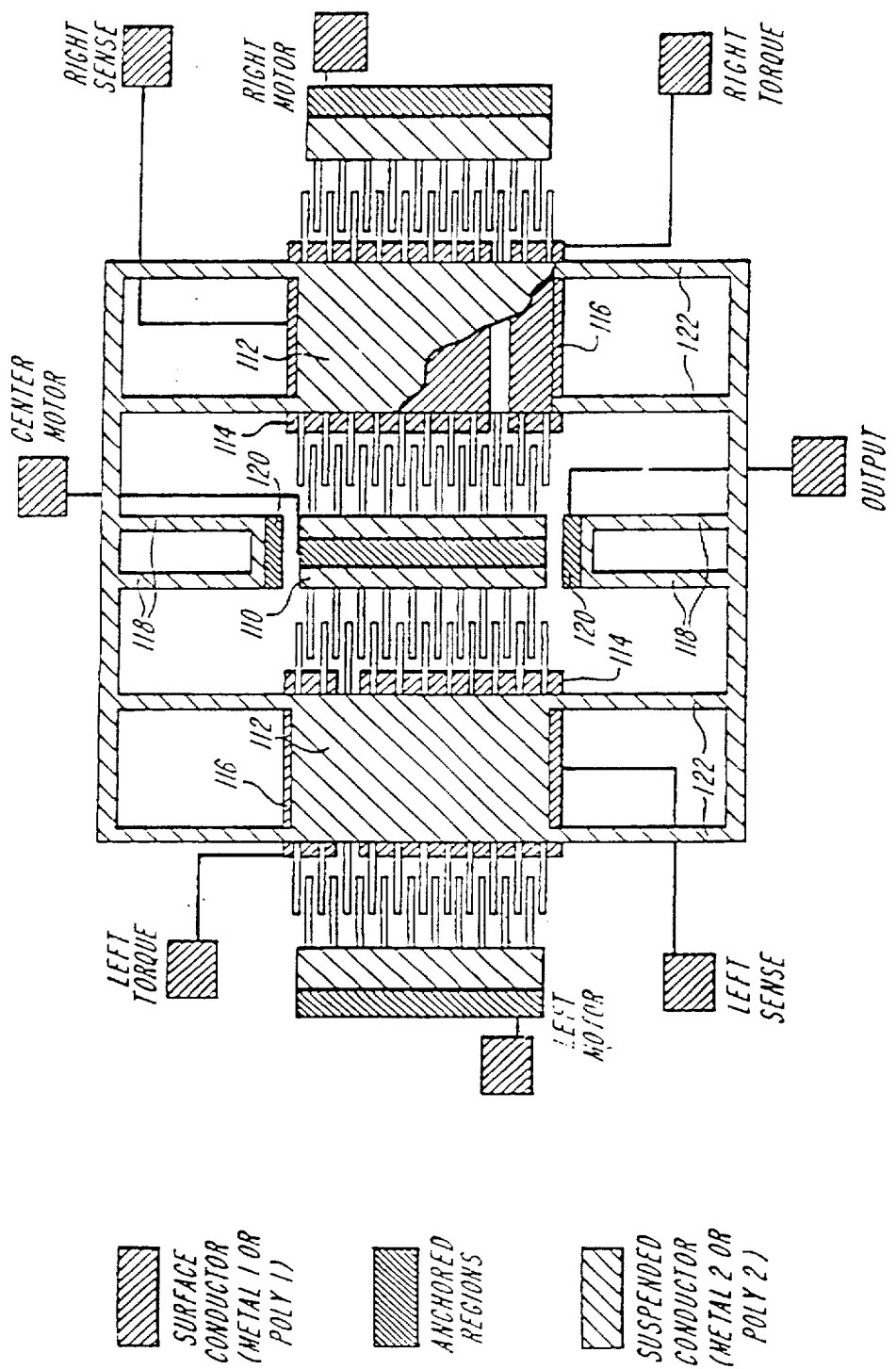
FIG. 1A is a top diagrammatic view of an alternative embodiment of a micromechanical comb drive tuning fork inertial rate sensor.
Figure 1B:
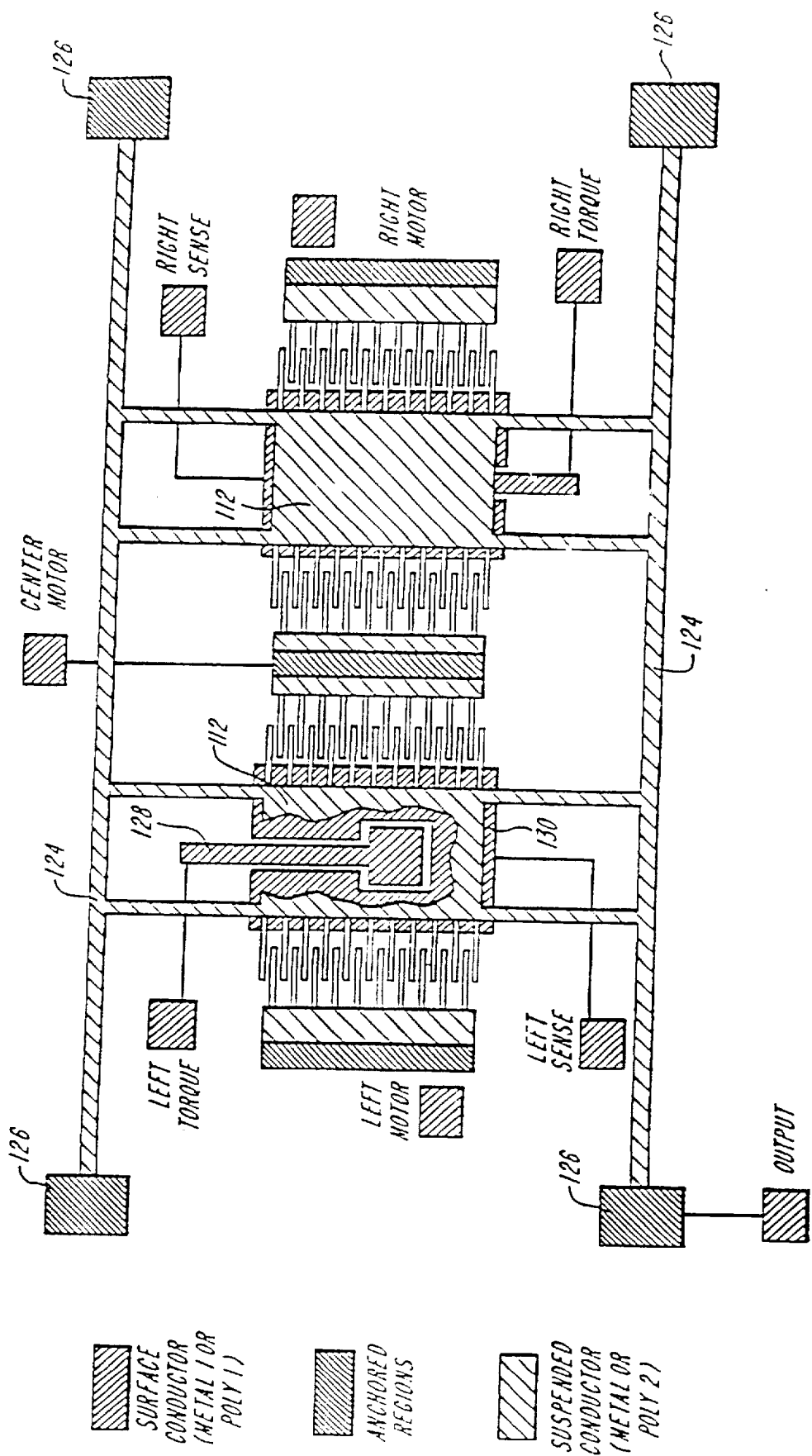
FIG. 1B is a top diagrammatic view of another alternative embodiment of a micromechanical comb drive tuning fork inertial rate sensor.
Figure 1C:
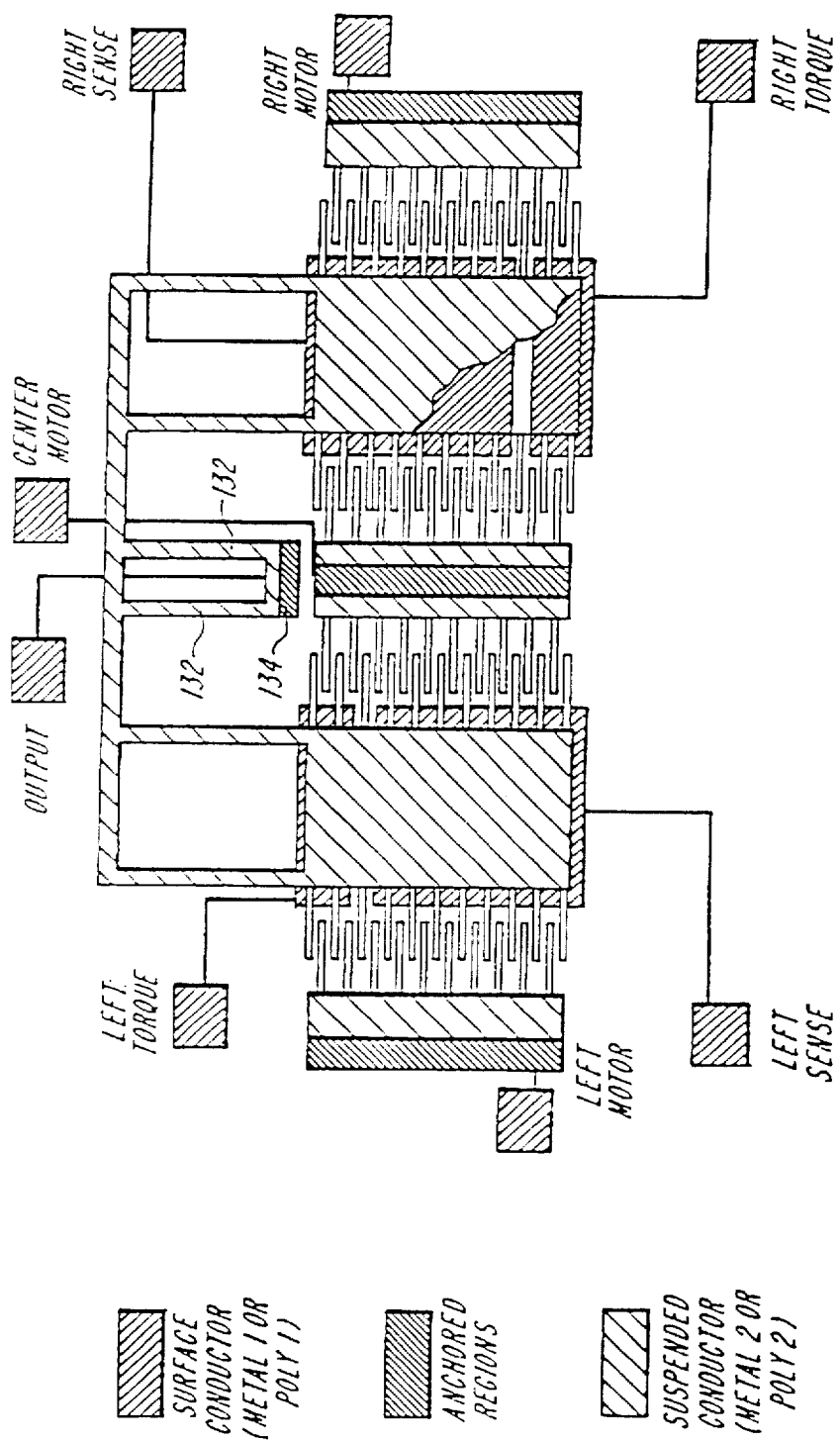
FIG. 1C is a top diagrammatic view of yet another alternative embodiment of a micromechanical comb drive tuning fork inertial rate sensor.
Figure 1D:
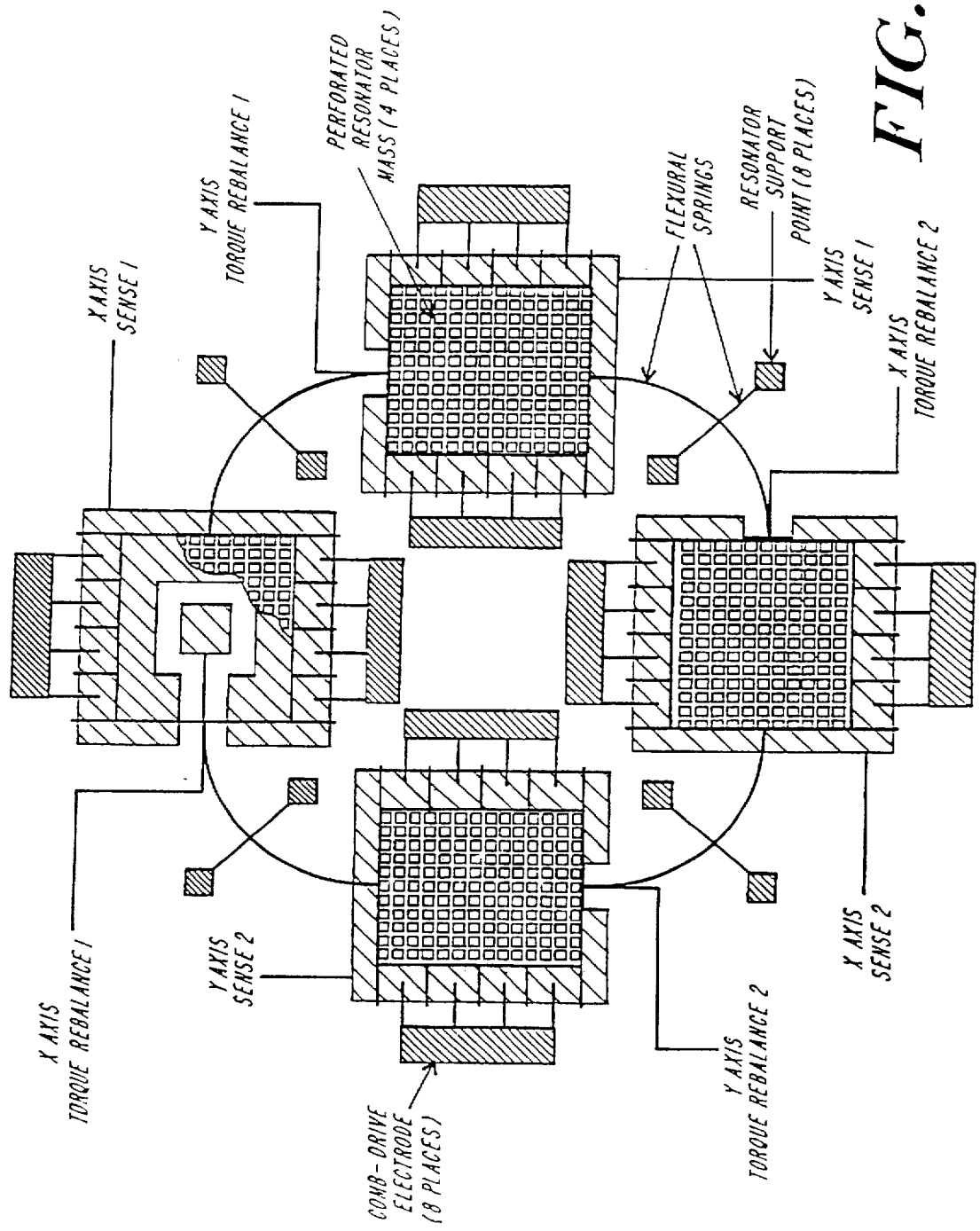
FIG. 1D is a top diagrammatic view of still another alternative embodiment of a micromechanical comb drive tuning fork inertial rate sensor.
Figure 1E:
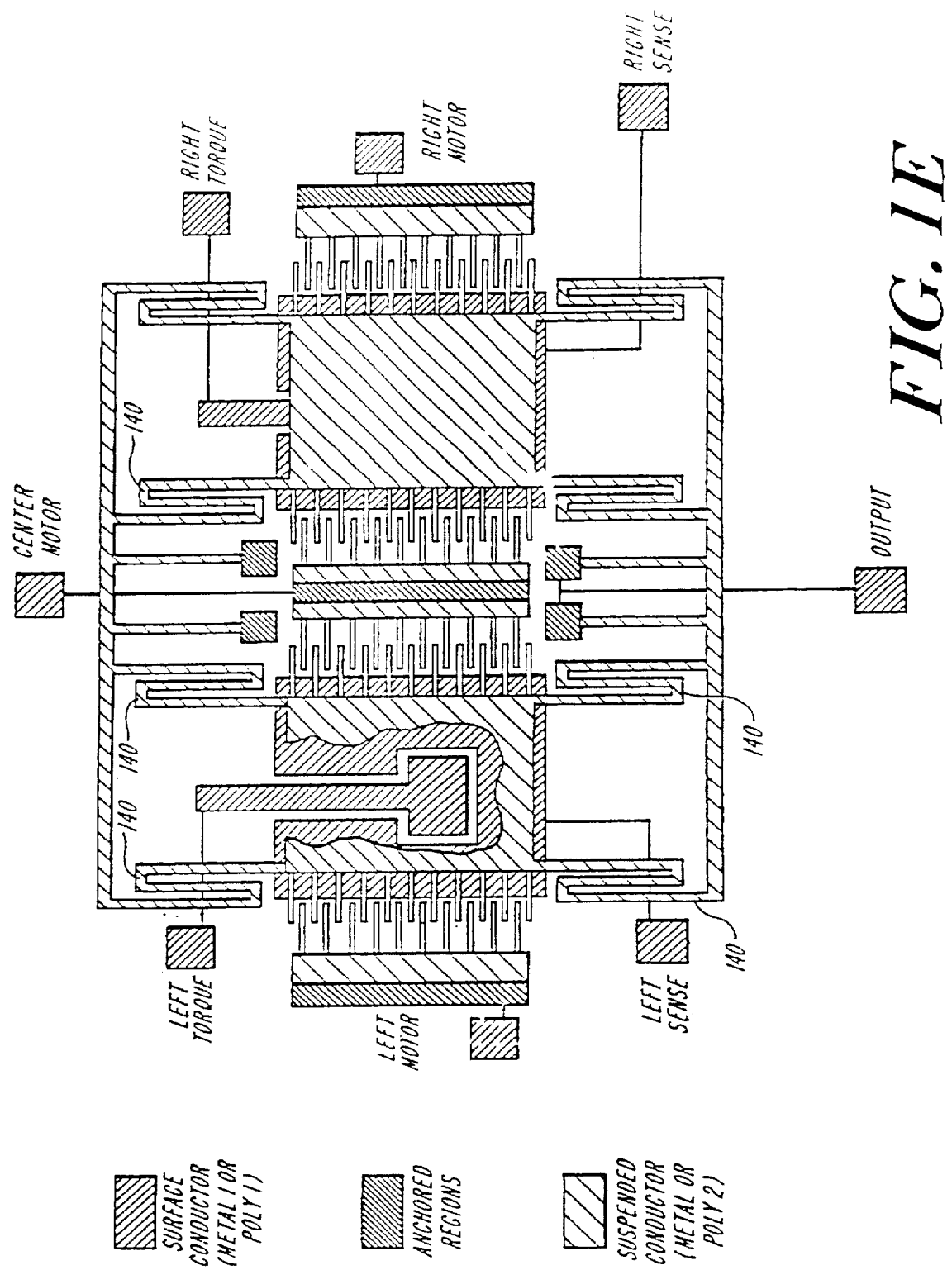
FIG. 1E is a top diagrammatic view of still another alternative embodiment of a micromechanical comb drive tuning fork inertial rate sensor.
Figure 2:
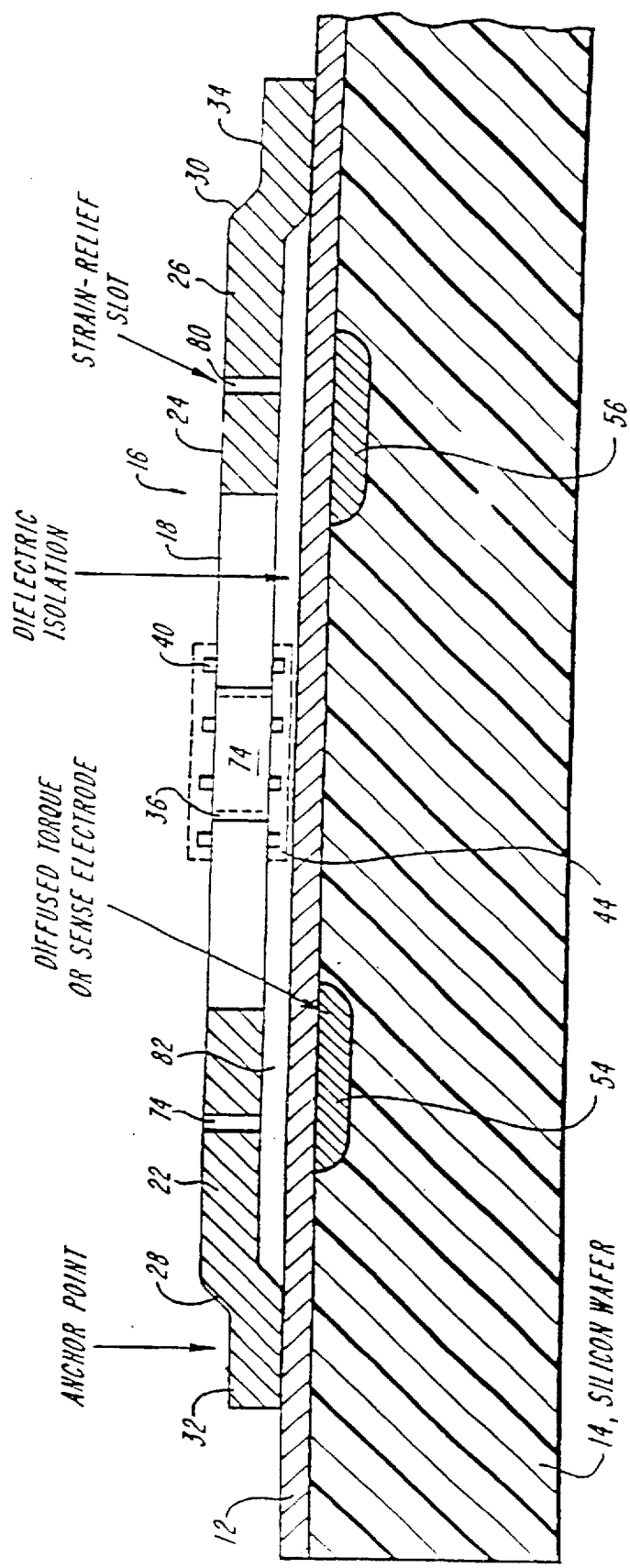
FIG. 2 is a side sectional view taken along sections of FIG. 1.
Figure 5:
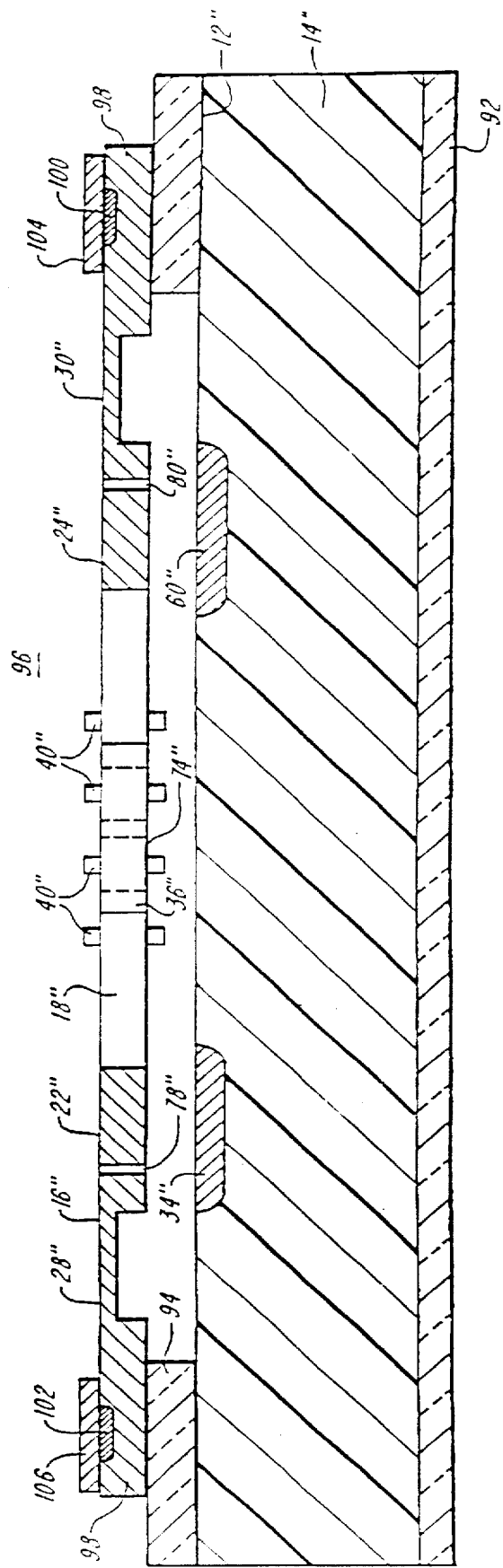
FIG. 5 is a sectional view of a yet further embodiment of the invention.

The proof masses are suspended from support elements 322, also referred to herein as support springs. In the illustrated embodiment, the support elements 322 extend from a first end of each of the proof masses 312 and form a Y-shape with a common support member 321 attached to an anchor point 323 through which the proof masses 312 are suspended above a substrate. The operating principle behind this transducer configuration is the same as that of the transducer of FIG. 1A, though in the present embodiment, underlying sense electrodes are replaced with piezoelectric transducers 300, 302 disposed on support springs 322. The stress and strain to which the transducers 300, 302 are subject causes a voltage which is detected by sense electronics (not illustrated) connected to sense contacts 308. This voltage is proportional to the input rate applied to the transducer.

In one embodiment of the present invention, a substrate 301 provides an N silicon frame 303 from which the gyroscope is suspended. Electrical contact points such as the sense contacts 308 are formed of conductive metal. The majority of the suspended structure is formed of P++ silicon, with the piezoelectric transducers fabricated of piezoelectric film as previously described.

Figure 9B:
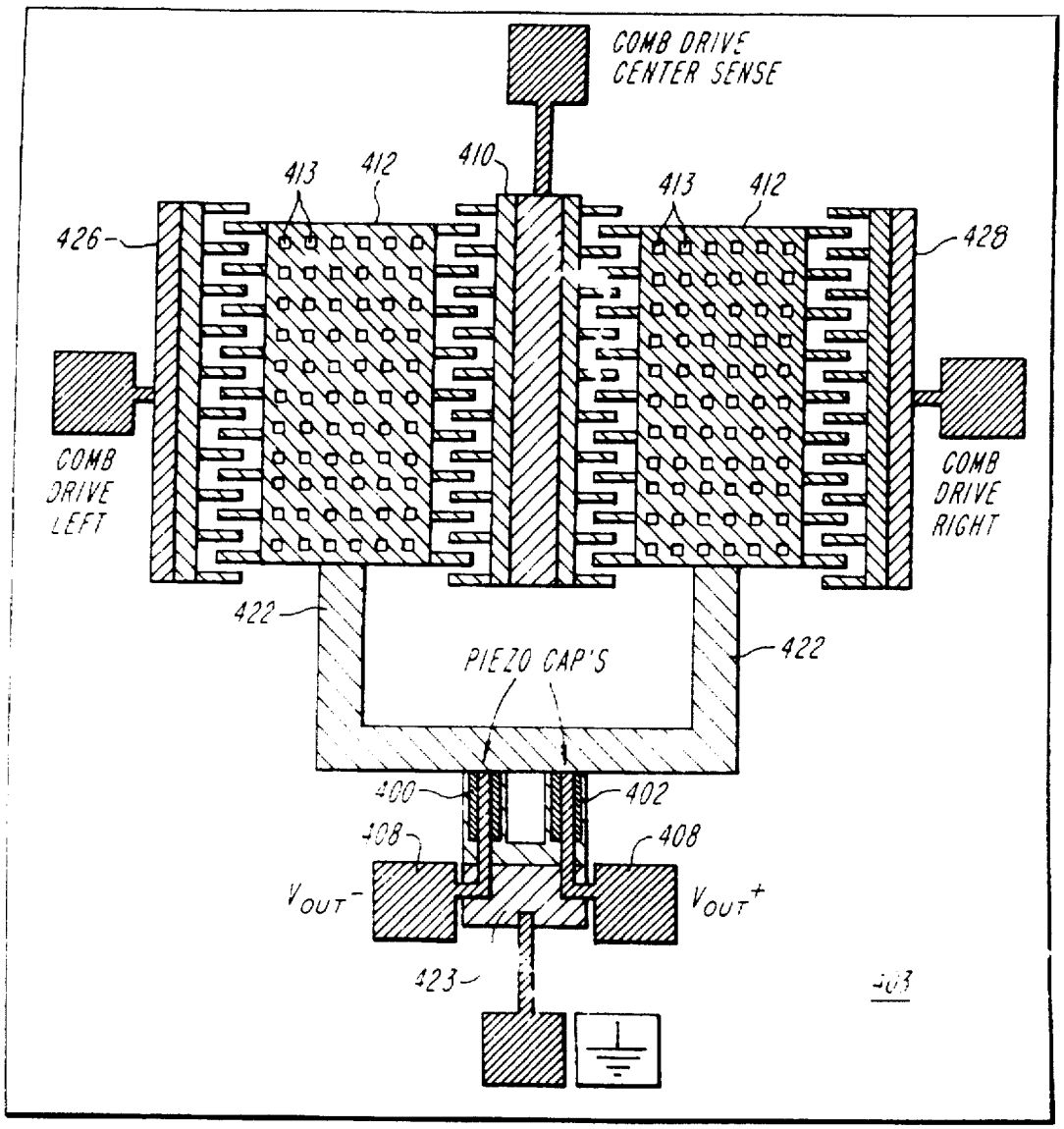
FIG. 9B is a top diagrammatic view of an alternative embodiment of the micromechanical comb drive tuning fork inertial rate sensor of FIG. 9A.

An alternative embodiment of the single ended comb-drive gyroscope is shown in FIG. 9B. The transducer shown in FIG. 9B is in many respects similar to that shown in FIG. 9A, and the like elements are labeled with the same numbers as FIG. 9A added to 100 (e.g., proof mass 312 in FIG. 9A is proof mass 412 in FIG. 9B). The transducer of FIG. 9B has the piezoelectric sence transducers 400, 402 located closer to the rotation axis compared to the transducer of FIG. 9A. By placing the sense transducers 400, 402 closer to the axis of rotation, the coriolis forces are mechanically amplified resulting in greater sensitivity.

Figure 10:
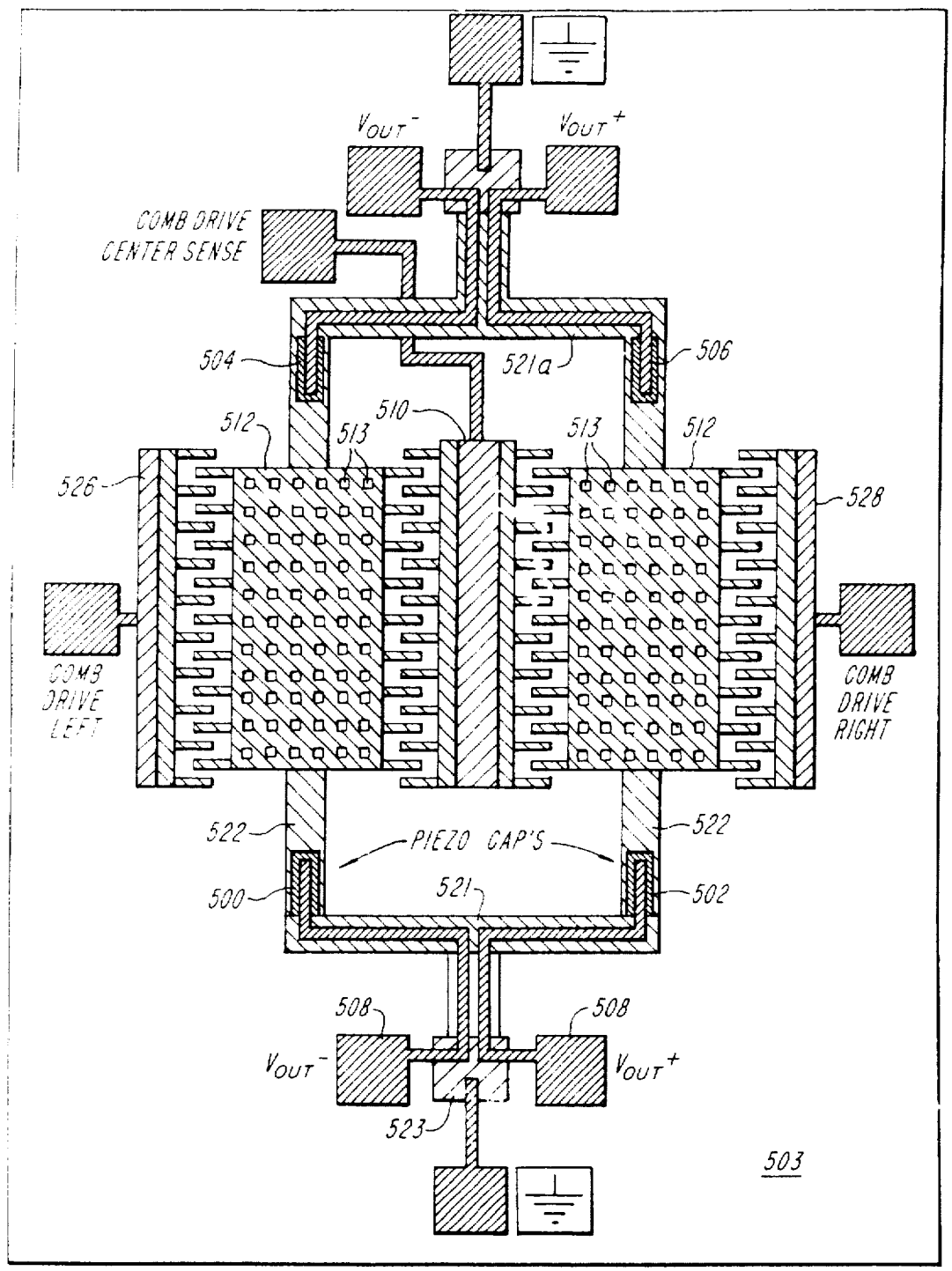
FIG. 10 is a top diagrammatic view of a further alternative embodiment of the micromechanical comb drive tuning fork inertial rate sensor of FIG. 9A.

In FIG. 10, a double-ended comb-drive gyroscope, a variant of the single-ended gyro of FIG. 9A, is illustrated. In this embodiment, a piezoelectric transducer 500, 502, 504, 506 is provided at each support spring 522. In the illustrated embodiment, two of the transducers 500, 502 are used to sense strain, and two 504, 506 are excited by torque drive electronics 320 to rebalance the device.

In an alternative embodiment, all four transducers 500, 502, 504, 506 are used to sense strain induced in the transducer by Coriolis forces. In this variant on the present invention, two or more underlying electrodes (not illustrated) can be used as rebalance electrodes connected to torque drive electronics, similar to the use of underlying electrodes 254, 256, 258, 260 described above with respect to FIGS. 8A and 8B. By employing either piezoelectric transducers or underlying electrodes to impart rebalancing force on the proof masses 512, the dynamic range and linearity of the device are improved, as well as the insensitivity of the device to temperature.

While various embodiments disclosed are implemented having separate electrodes for sensing and torquing, it should be appreciated that a single air-gap capacitor can be used in association with each proof mass to effect both the torque and sense functions by frequency multiplexing.

Further, while closed loop systems are discussed hereinabove and in the referenced patents and applications, one of ordinary skill in the art will appreciate that various embodiments of the gyroscopic transducer disclosed can be operated open loop so as to dispense with the torque to rebalance loop. Although such operation limits dynamic range, device operation and control electronics may thusly be simplified.

Figure 11:
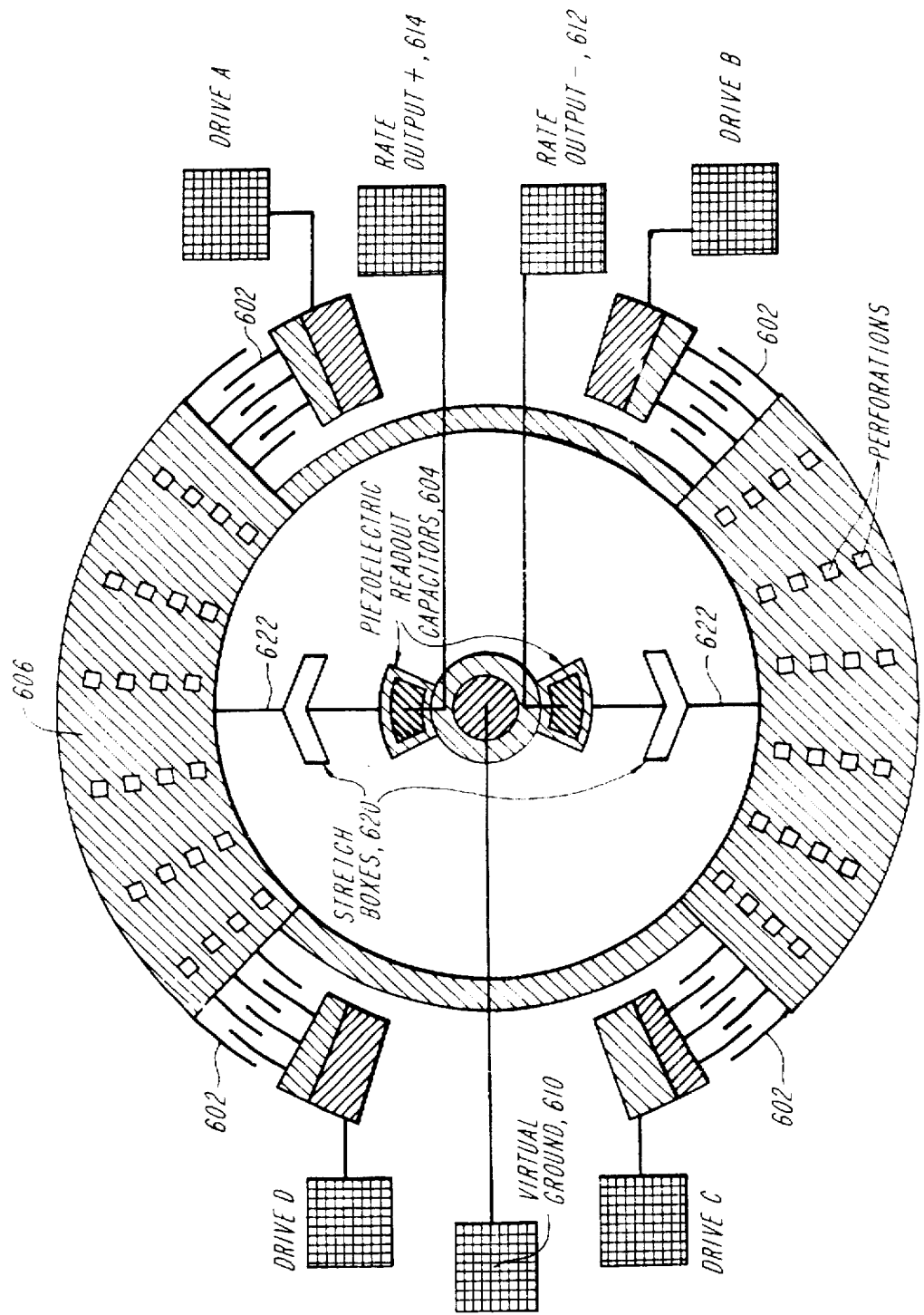
FIG. 11 is a top diagrammatic view of a micromechanical vibrating wheel inertial rate sensor having piezoelectric sensors.

A further alternative embodiment of a micromechanical rate sensitive device employing piezoelectric film sensors is illustrated in FIG. 11. In particular, a vibrating wheel gyroscope having comb drive electrodes 602 and piezoelectric sense transducers 604. Drive electrodes labelled "A" through "D" are used to impart vibration to the wheel 606 through a constant amplitude of angular motion in conjunction with the resonator electrode 610 which is held at virtual ground. The sensed output is taken differentially from the two piezoelectric readout electrodes 612A, 612B, labelled "Rate Output +" and "Rate Output –", respectively.

Stretch boxes 620 are provided on the rotational flexures 622 to allow large angular displacement without spring stiffening. Nearly constant frequency of vibration is thereby maintained as a function of the amplitude of wheel 606 oscillation.

Figure 12:
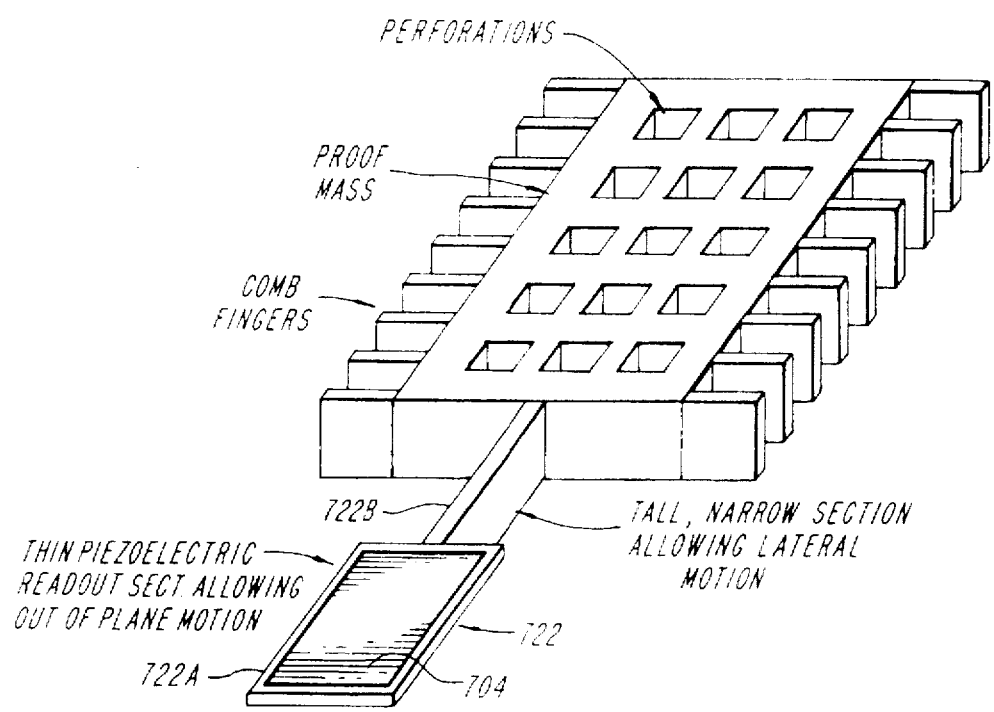
FIG. 12 is a diagrammatic view showing a single proof mass supported by flexures having a thin piezoelectric readout section and a narrow, thick region allowing in-plane motion.
Figure 13:
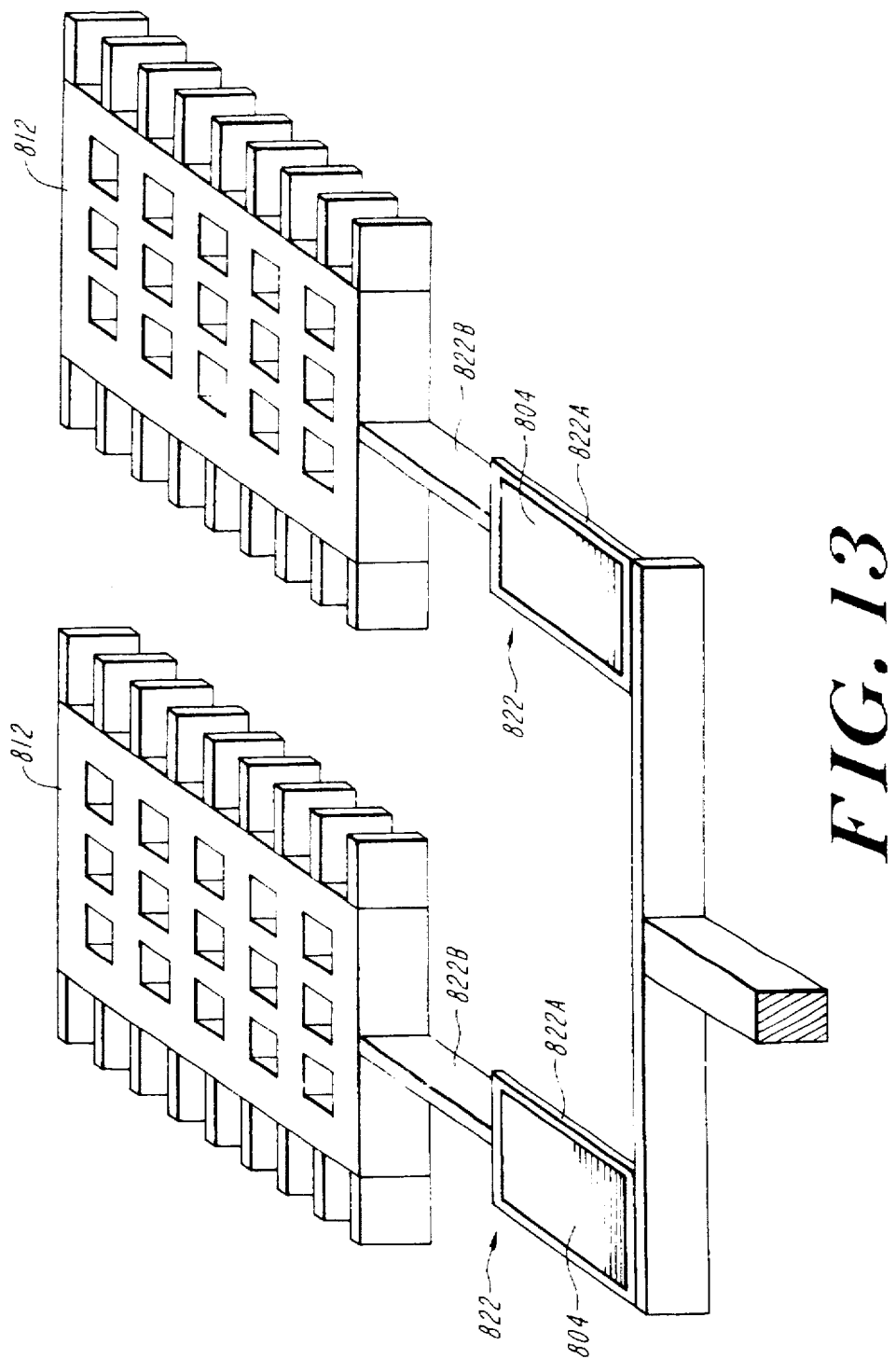
FIG. 13 is a diagrammatic view of two proof masses similar to that shown in FIG. 12 attached to a common support flexure.

In the illustrated embodiments of the present invention, the support springs which support the proof masses are designed to maintain the drive mode resonant frequency within a few percent of the readout mode resonant frequency. Thus, such springs are fabricated as tall and narrow beams. However, in a further embodiment of the present invention shown in FIG. 12, the piezoelectric transducers 704 are disposed on regions 722A of the springs 722 which are relatively thinner than the remainder 722B of the support springs 722. Thus, the piezoelectric transducers 704 are sited at regions which are more prone to out-of-plane motion, and are thus more sensitive to such motion than capacitors disposed on springs of standard thickness. FIG. 13 shows a pair of proof masses 812 supported by a system of springs 822 including both thin piezoelectric readout sections 822A and narrow, thick sections 822B allowing in-plane motion.

Although the invention has been shown and described with respect to illustrative embodiments thereof, it should be understood by those of ordinary skill in the art that the foregoing and various other changes, additions and omissions in the form and detail thereof may be made without departing from the spirit and scope of the invention as delineated in the claims.

We claim:

1. An inertial rate sensor comprising:
   a semiconductor mass;
   a plurality of suspension elements parallel to a first axis and each having at least one end thereof anchored to said mass;
   a first weighted element suspended from said suspension elements to rotate about said first axis and adapted to vibrate in a direction substantially orthogonal to said first axis;
   a set of driven electrodes projecting from said suspended element in the direction of vibration;
   a set of drive electrodes freely meshing with said set of driven electrodes;
   a source of vibration drive contacting said set of drive electrodes to induce vibration of said suspended element;
   a plurality of position sensors placed at locations along said suspension elements which are thinner than regions of said suspension elements which are thinner than regions of said suspension elements where no position sensors are disposed, wherein rotation of said suspended element about said first axis creates strain-induced voltage within said position sensors; and
   a signal sensor responsive to at least a subset of said plurality of position sensors for receiving a signal varying with rotation of said element about said axis.

2. The rate sensor of claim 1 further including a second suspended, weighted element extending substantially parallel to said first suspended element on an opposite side of said axis of rotation and having a corresponding second driven electrode set meshing with a corresponding second drive electrode set connected to said drive source to induce vibration of said second vibrating element.

3. The rate sensor of claim 1, wherein at least some of said plurality of position sensors are utilized as rebalancing elements for imparting rebalancing force upon said suspended element in response to being energized relative to said suspended element, and
   wherein said rate sensor further comprises an electrical signal source for energizing said rebalancing elements relative to said suspended element.

4. A comb drive tuning fork microfabricated structure comprising:
   a substrate;
   an assembly on said substrate having:
   first and second elongate vibratable elements joined at the ends thereof by first and second support elements so that said first and second vibratable elements extend substantially parallel to each other and to a rotation axis running therebetween;
   first and second flexures extending from said support elements away from said first and second vibratable elements to points of attachment to said substrate along said axis allowing said first and second support elements and said first and second vibratable elements to rotate about said axis;
   first and second weights respectively attached to said first and second vibratable elements;
   each said first and second vibratable element having a plurality of driven electrodes projecting away therefrom in a direction orthogonal to said axis;
   first and second drive electrodes extending between the driven electrodes of said first and second vibratable elements, said first and second drive electrodes being physically attached to said substrate but electrically isolated therefrom; and
   at least one sense element disposed on each of said first and second flexures, said at least one sense element being disposed on a region of said flexures thinner than regions of said flexures not having said at least one sense element disposed thereon, wherein rotation of said vibratable elements about said rotation axis creates a strain-induced voltage in said at least one sense element.

5. The structure of claim 4 wherein said vibratable elements, said driven and drive electrodes, said weights, said support elements and said flexures are selected from the group consisting of conductive silicon, conductive polysilicon, and a plated metal.

6. The structure of claim 5 wherein said plated metal is selected from the group consisting of nickel, gold and iron-nickel alloys.

7. The structure of claim 5 wherein said substrate comprises a dielectric surfaced silicon substrate wherein said drive electrodes and said flexures are attached to the dielectric surface thereof.

8. The structure of claim 5 further including a stress relief slit in said support elements adjacent to a point of attachment for the flexures.

9. The structure of claim 7 wherein said sense elements include regions selected from the group consisting of piezoelectric, ferroelectric or electrostrictive films.

10. The structure of claim 9 wherein said film regions are selected from the group consisting of lead zirconate titanate (PZT), zinc oxide (ZnO), lead magnesium niobate (PMN) and barium titanate ($BaTiO_3$).

11. The structure of claim 9 wherein said regions of piezoelectric films are 0.1 to 10 microns thick.

12. The structure of claim 4 further including a source of electrical drive energy attached to said drive electrodes and through said flexures to said driven electrodes for inducing vibration of said vibratable elements in a direction orthogonal to said axis of rotation;
    a sense signal sensor cooperatively connected to said sense elements and said flexures to provide an indication of rotation of said first and second support elements about said rotation axis in response to inertial rates applied to said vibratable elements when vibrating.

13. The structure of claim 12 further comprising at least one underlying electrode in said substrate under each of said support elements at a location distant from said axis of rotation; and
    wherein said structure further comprises a source of torque electrical energy connected to at least a subset of said underlying electrodes to torque said first and second support elements to a pre-determined position in response to sensed signals representative of rotation of said first and second support elements.

14. The structure of claim 4 wherein said vibratable elements each further comprise a plurality of through-holes disposed therein from an upper vibratable element surface to an underlying vibratable element surface.

15. A micromechanical transducer comprising:
    a silicon substrate;
    an assembly on said substrate having:
    first and second proof mass structures each suspended above said substrate by at least one support structure attached therebetween so that said proof mass structures extend substantially parallel to each other and to a rotational axis extending therebetween;

each said first and second proof mass structures having a plurality of driven electrodes projecting away therefrom in a direction orthogonal to said axis, said plurality of driven electrodes including an outer set of driven electrodes extending away from said axis and an inner set extending toward said axis;

first and second drive electrodes extending between said outer set of driven electrodes of said first and second proof mass structures, and third drive electrodes extending between said inner set of driven electrodes of said first and second proof mass structures, said first, second and third drive electrodes being physically attached to said substrate but electrically isolated therefrom; and a plurality of sense elements disposed on said at least one support structure for generating a signal representative of a degree of rotation of said first and second proof mass structures about said rotational axis due to strain induced by said rotation, said plurality of sense elements being disposed along regions of said support structure which are thinner than surrounding regions of said support structure.

16. The micromechanical transducer according to claim 15, said at least one support structure comprising:

a plurality of support elements, each substantially parallel to said axis and each having a first end attached to at least one end of a respective one of said first and second proof mass structures;

a common support member disposed substantially orthogonal to said axis and attached to a second end of said support elements; and an anchor and beam structure, said anchor physically attached to said substrate and said beam extending from said anchor above and substantially parallel to said substrate and substantially parallel to said axis, said beam connected proximate to a midpoint of said common support member, wherein said plurality of support elements and said common support member are disposed for rotation about said axis.

17. The micromechanical transducer according to claim 16, wherein said plurality of sense elements are disposed along said plurality of support elements.

18. The micromechanical transducer according to claim 15, wherein said sense elements each include regions selected from the group consisting of piezoelectric, ferroelectric or electrostrictive films.

19. The micromechanical transducer according to claim 18, wherein said film regions are selected from the group consisting of lead zirconate titanate (PZT), zinc oxide (ZnO), lead magnesium niobate (PMN) and barium titanate (BaTiO$_3$).

20. The micromechanical transducer according to claim 15 further including a source of electrical drive energy attached to said first, second and third drive electrodes and through said support structures to said driven electrodes for inducing vibration of said proof mass structures in a direction orthogonal to said axis of rotation; and a sense signal sensor cooperatively connected to said sense elements to provide an output indicative of said signal reflective of rotation of said first and second proof mass structures about said rotation axis in response to inertial rates applied to said proof mass structures when vibrating.

21. The micromechanical transducer according to claim 20 further comprising a source of torque electrical energy connected to a subset of said plurality of sense elements as rebalance elements to torque said first and second proof mass elements to a pre-determined position in response to said sense element output.

22. The micromechanical transducer according to claim 20 further comprising a source of torque electrical energy connected to a plurality of torque electrodes in said substrate under said proof mass elements at locations distant from said axis of rotation to torque said first and second proof mass elements to a predetermined position in response to said sense element output.

23. The micromechanical transducer according to claim 15 wherein said proof mass structures each further comprise a plurality of through-holes disposed therein from an upper proof mass surface to an underlying proof mass surface.

24. The micromechanical transducer according to claim 16, wherein said beam is comprised of a cross portion affixed to said anchor and two flex portions each extending from said cross portion to a point proximate a mid-point of said common support member; and wherein said plurality of sense elements are each disposed along a respective one of said flex portions.

* * * * *

UNITED STATES PATENT AND TRADEMARK OFFICE
CERTIFICATE OF CORRECTION

PATENT NO. : 5,767,405
DATED : June 16, 1998
INVENTOR(S) : Jonathan J. Bernstein, et al.

It is certified that error appears in the above-identified patent and that said Letters Patent is hereby corrected as shown below:

Column 2, line 30, "capacitors" should read --transducers--.

Column 4, line 18, "are employed to are sense electronics," should read --are employed to detect strain induced voltage in the piezoelectric transducers at sense electronics,--.

Column 4, line 23, "illsutrated" should read --illustrated--.

Column 4, line 29, "operates" should read --operate--.

Column 5, line 63, "sence" should read --sense--.

Column 7, lines 24 and 25, claim 1, "which are thinner than regions of said suspension elements which are thinner than regions of said suspension elements" should read --which are thinner than regions of said suspension elements--.

Signed and Sealed this

Seventh Day of December, 1999

Attest:

Q. TODD DICKINSON

*Attesting Officer*  Acting Commissioner of Patents and Trademarks